(12) United States Patent
Dahl et al.

(10) Patent No.: US 8,105,966 B2
(45) Date of Patent: *Jan. 31, 2012

(54) CUTTING TOOL INSERT

(75) Inventors: Leif Dahl, Hägersten (SE); Mikael Lindholm, Vårby (SE)

(73) Assignee: Sandvik Intellectual Property AB, Sandviken (SE)

( * ) Notice: Subject to any disclaimer, the term of this patent is extended or adjusted under 35 U.S.C. 154(b) by 660 days.

This patent is subject to a terminal disclaimer.

(21) Appl. No.: 12/081,638

(22) Filed: Apr. 18, 2008

(65) Prior Publication Data

US 2008/0264203 A1  Oct. 30, 2008

(30) Foreign Application Priority Data

Apr. 27, 2007 (SE) ...................... 0701028

(51) Int. Cl.
*C04B 35/00* (2006.01)
(52) U.S. Cl. ...................... 501/96.4; 501/96.3
(58) Field of Classification Search ............... 501/96.3, 501/96.4
See application file for complete search history.

(56) References Cited

U.S. PATENT DOCUMENTS

| | | | |
|---|---|---|---|
| 4,911,756 A | 3/1990 | Nakai et al. | |
| 6,265,337 B1 | 7/2001 | Kukino et al. | |
| 6,316,094 B1 | 11/2001 | Fukaya et al. | |
| 7,112,235 B2 | 9/2006 | Tajima et al. | |
| 7,670,980 B2 * | 3/2010 | Dahl | 501/96.4 |
| 2005/0152804 A1 | 7/2005 | Sjogren | |
| 2007/0099030 A1 | 5/2007 | Dahl | |

FOREIGN PATENT DOCUMENTS

| | | |
|---|---|---|
| EP | 0 834 486 A2 | 4/1998 |
| EP | 1726390 A1 | 11/2006 |
| JP | 08-197305 | 8/1996 |
| JP | 10-114575 | 5/1998 |
| JP | 2005-262388 A | 9/2005 |
| WO | 2006/046125 | 5/2006 |
| WO | WO-2006/046124 A1 | 5/2006 |
| WO | WO-2008/130316 A1 | 10/2008 |

OTHER PUBLICATIONS

Office Action issued Apr. 5, 2011, by the Japanese Patent Office in Japanese application No. 2008-114385.
Extended European Search Report issued Jun. 7, 2011, in European Patent Application No. EP 08 10 3610.5.
Jeon et al., "Synthesis and characterization of quaternary Ti-Si-C-N coatings prepared by a hybrid deposition technique," Surface & Coatings Technology, 188-189, 2004, pp. 415-419.

* cited by examiner

*Primary Examiner* — David M. Brunsman
*Assistant Examiner* — Kevin Johnson
(74) *Attorney, Agent, or Firm* — Morgan, Lewis & Bockius LLP

(57) ABSTRACT

The present invention relates to a cutting tool insert preferably for machining of hardened steel, hot and cold working tool steel, die steel, case hardened steel, high speed steel and ductile grey cast iron and composed of a composite comprising from about 30 to less than about 60 vol-% of a cBN-phase and a binder phase comprising a titaniumcarbonitride phase and a $TiB_2$ phase. According to the invention, in the XRD pattern from the composite using $CuK\alpha$-radiation the peak height ratio of the strongest $TiB_2$ peak and the strongest cBN peak is less than about 0.02.

11 Claims, 2 Drawing Sheets

CUTTING TOOL INSERT

BACKGROUND OF THE INVENTION

The present invention relates to a cutting insert including cubic boron nitride with an excellent wear resistance and maintained resistance to chipping and edge fracture when machining hard materials like hardened steel and alike.

Cubic boron nitride (cBN)-based ceramics sintered under high pressure and high temperature are known.

Generally, cBN-based materials for hard part machining have cBN as the hard dispersed phase and a ceramic binder to form a sintered hard cutting tool. The cBN material for cutting tools normally has a cBN content ranging from 40 to 90 vol-% and a ceramic binder phase consisting generally of a nitride, carbonitride or carbide of titanium with less amounts of borides of Ti, W, Co, Al or a solid solution of these, alumina and other unavoidable reaction products. By varying the relative amounts of the ingredients, cBN tools can be designed for optimum performance in different applications, e.g., continuous or interrupted cutting. cBN tools with relatively high cBN content are recommended for toughness demanding interrupted to heavy interrupted cutting applications, whereas high ceramic binder content gives the high wear resistance necessary in continuous cutting.

Thus, in wear demanding cutting applications run at high cutting speed and low cutting depth, and a feed ranging from continuous to lightly interrupted, a low cBN content is chosen. There is, however, a need of further improved cBN-based tools since a higher productivity with reduced costs is required from the industry. Generally this implies higher cutting speeds and in particular higher cutting depths and feeds. However, during continuous machining, the entrance and exit of the insert cause a sudden extra load at the cutting edge and machine instability may cause an intermittent behavior. Both the effects may result in unacceptable edge failure. Consequently, cutting tools with improved wear resistance without loss in edge failure resistance are desired, in order to meet the demands from the machining industry.

In the past it has been proposed to use an intermediate adhesion phase between the ceramic binder and the hard dispersed phase (U.S. Pat. No. 7,112,235) in order to increase chipping resistance. A bonding phase surrounding the cBN grains has also been proposed (U.S. Pat. No. 6,316,094) in order to prevent a direct cBN-cBN contact. The bonding phase is formed due to a chemical reaction between cBN or $B_2O_3$ residuals coating the cBN grains and the ceramic binder forming $TiB_2$. Furthermore, cBN grains have been pre-coated by a nitride or boride of Ti and Al by a PVD-process in order to enhance the reinforcing rim surrounding the cBN grains (U.S. Pat. No. 6,265,337). U.S. Pat. No. 4,911,756 discloses a sintered compact containing 50 to 70 vol-% cBN and a binder containing 25 to 50 wt-% Al, one or more Ti compounds, and W or one or more W compounds, whereby the W content in the binder is 4 to 40 wt-%.

WO 2006/046125 discloses a cBN compact with a secondary hard phase of TiCN, TiC, TiN and mixtures and solid solutions. The $TiB_2$ peak height (measured as the percentage of the cBN peak height) is disclosed to be from 2.5 to less than 12% using the measurement technique described in that publication.

OBJECTS AND SUMMARY OF THE INVENTION

It is an object of the present invention to provide a cBN-based cutting tool insert with high wear resistance and maintained edge failure resistance.

The present invention provides a cutting tool insert composed of a composite comprising a cBN-phase and a binder phase comprising a titaniumcarbonitride phase and a $TiB_2$ phase wherein the cBN content is from about 30 to less than about 60 vol-% and in the XRD pattern from the composite using CuKα-radiation the peak height ratio of the strongest (101) $TiB_2$ peak and the strongest cBN (111) peak is less than about 0.02, and the (200) peak from the titanium carbonitride phase intersects the vertical line of the PDF-line of TiN, PDF 38-1420, where the intersected point height is less than about 0.10 of the maximum (200) peak height of the ceramic binder phase.

DETAILED DESCRIPTION OF THE PREFERRED EMBODIMENTS

Figure 1:
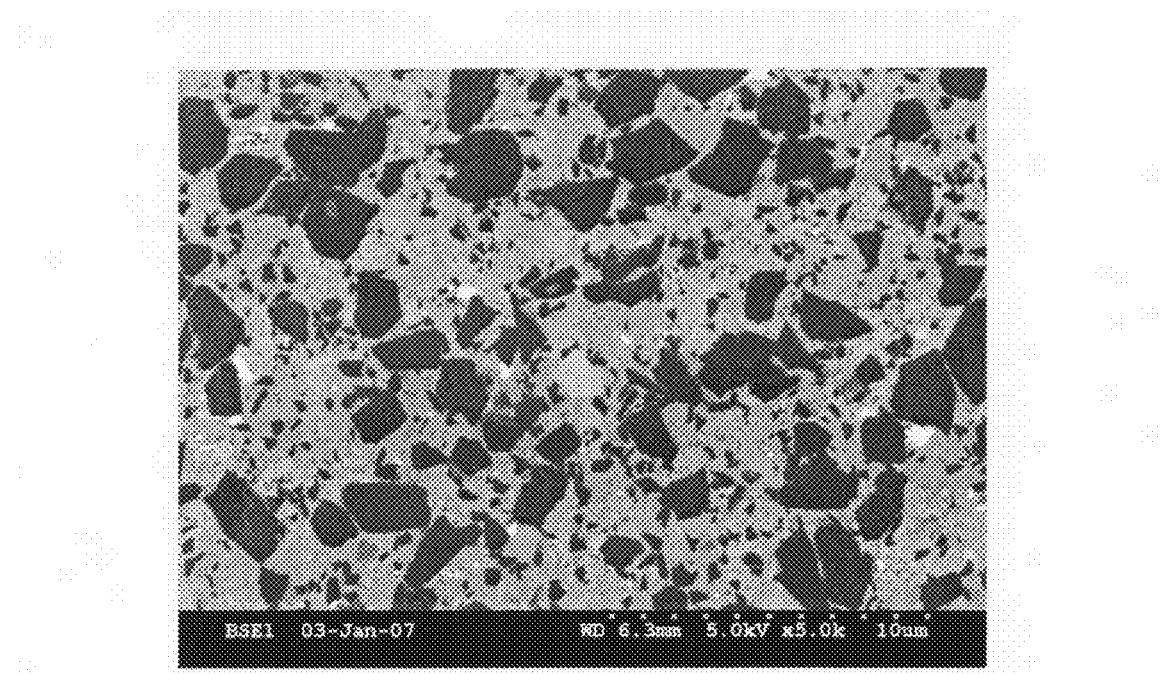
FIG. 1 shows a Scanning Electron Microscope (SEM) micrograph of a cBN material according to the invention.

It has now been found that an intermediate phase between the ceramic binder phase and the hard dispersed cBN phase can actually decrease the edge toughness of the insert material, because one very important mechanism for toughening, namely crack deflection, is minimized. If the bonding between the different phases in the material is too strong, a formed crack will easily propagate through the material in a very straight manner, leading to a low value of fracture toughness. If the bonding is too weak, it would mean a significantly reduced wear resistance. If, however, the bonding is balanced, meaning it should be lower than the intrinsic strength of the grains, the crack will preferably propagate along the grain boundaries meaning higher toughness. The desired strength of the bonding of the cBN grains and the ceramic binder can be achieved by carefully controlling the sintering temperature and the reactivity of the raw materials.

The invention thus relates to a cutting tool insert preferably for machining in highly continuous operations of hardened steel, hot and cold working tool steel, die steel, case hardened steel, high speed steel and ductile grey cast iron. The cutting tool insert can be either a solid cBN tool or a cBN compact attached to a cemented carbide substrate. It is composed of a coated or uncoated composite comprising a cBN phase and a binder phase comprising a titaniumcarbonitride phase and a $TiB_2$ phase. The composite comprises from about 30 to less than about 60, preferably from about 35 to less than about 50, more preferably from about 35 to less than about 48, most preferably from about 35 to less than about 45, vol-% cBN with an average grain size of less than about 5 µm, preferably from about 1 to about 4 µm, preferably with a bimodal cBN grain size distribution comprising more than about 10 vol-% of one fraction having a grain size of from about 0.1 to about 1 µm and more than about 10 vol-% of a second fraction having a grain size of from about 2 to about 5 µm. In the XRD pattern of the composite using CuKα-radiation, and also using background subtraction and $K\alpha_2$ strip of the peaks, the peak height ratio of the strongest $TiB_2$ peak and the strongest cBN peak is less than about 0.02, preferably essentially zero. The ratio is determined as the peak height ratio between the strongest $TiB_2$ (PDF 35-0741) peak (101) and strongest cBN (PDF 35-1365) peak (111), $I_{TiB2(101)}/I_{cBN(111)}$. In addition, the peak height ratio from the strongest peak of any borides of Ti, W, Co, Al and combinations thereof, except $TiB_2$, and the strongest cBN peak is in one embodiment of the invention, less than about 0.06.

A further characteristic, in one embodiment of the invention, is the presence of at least one peak from the titanium carbonitride phase in the XRD-pattern, wherein the (200) peak from the titanium carbonitride phase intersects the vertical line of the abovementioned PDF-line of TiC (PDF 32-1383) and the intersected point height is at least about 0.10, preferably at least about 0.15, of the maximum (200) peak height of the ceramic binder phase. A still further characteristic of the invention is that the (200) peak from the titanium carbonitride phase intersects the vertical line of the abovementioned PDF-line of TiN (PDF 38-1420) intersected point height is less than about 0.10, preferably less than about 0.05, of the maximum (200) peak height of the ceramic binder phase, most preferably the (200) peak from the titanium carbonitride phase does not intersect the vertical line of the abovementioned PDF-line of TiN (PDF 38-1420). This indicates a narrow compositional range of $TiC_{1-x}N_x$ from TiC to TiN. This is determined using point focus which is preferred in order to characterize small samples often brazed to a cemented carbide substrate without obtaining interfering diffraction noise from the substrate.

Material according to the invention may further comprise up to about five weight percent tungsten carbide from the milling with cemented carbide balls and alumina formed from reaction between Al and unavoidable oxygen in the raw materials.

The cBN cutting tool insert according to the present invention is made using conventional powder metallurgical technique: milling, pressing and sintering at elevated pressure. According to the method of the present invention powders forming the ceramic binder phase, Ti(C,N), stoichiometric or preferably substoichiometric and the metallic binder phase, Al, are pre-milled in an attritor mill to a very fine grained powder. The attrition milled powder is then mixed and milled together with the cBN powder raw material. After milling the powder is dried and compacted to form a circular compact. The compact is then pre-sintered at a temperature between about 850 and about 1250° C. for about 1 hour.

The pre-sintered compact is then sintered either by itself or on a cemented carbide substrate in an ultra high pressure sintering apparatus at a pressure of about 5 GPa at a temperature in the range from about 1200 to about 1325° C., preferably about 1300° C., for from about 15 to about 30 min. The sintering temperature and time is chosen so that a complete sintering is achieved with respect to porosity but excess temperatures and times must be avoided in order to minimize the chemical reaction between the ceramic binder and the hard cBN phase. This optimum sintering temperature depends on the composition, stoichiometry of the ceramic binder phase and grain size of all the raw materials. It is within the purview of the skilled artisan to determine by experiments the conditions necessary to obtain the desired microstructure using his equipment. The temperature is generally in the range from about 1200 to about 1325° C.

In one embodiment, the sintered compact is then cut into desired shape using an arc discharge wire-cut after top and bottom grinding. The sintered cBN compact pieces are then brazed on to a cemented carbide substrate and ground to desired shape and dimension as known in the art, e.g., US 2005/0152804 (the "SafeLok concept").

In another embodiment, the sintered cBN compact is finished ground to desired shape and dimension without being brazed to a cemented carbide substrate (solid cBN).

The ground inserts may further be coated with wear resistant PVD and CVD layers as known in the art, e.g., TiN, (Ti,Al)N, and $Al_2O_3$.

The invention is additionally illustrated in connection with the following examples, which are to be considered as illustrative of the present invention. It should be understood, however, that the invention is not limited to the specific details of the examples.

EXAMPLE 1 cBN-inserts according to the present invention were prepared by ball milling powders of 37.7 wt-% cBN, the cBN grains having a bimodal grain size distribution comprising 30 vol-% of 0.2-0.6 μm grain size and 70 vol-% of 2-4 μm grain size, 6.1 wt-% Al binder phase and rest of a non-stoichiometric ceramic binder phase of $Ti(C_{0.7}N_{0.3})_{0.8}$. The binder and ceramic binder had been attrition milled to produce a fine grained intimate mixture thereof prior to ball milling with cBN.

After ball milling the powder was dried and compacted to form a disc with a diameter of 53 mm. The disc was pre-sintered at a temperature of about 900° C. for 1 hour.

The pre-sintered disc was then sintered in an ultra high pressure sintering apparatus at a pressure of 5 GPa and a temperature of 1300° C. for 20 min.

The cBN-inserts were analyzed in a Bruker D8 Discover diffractometer under the conditions according to Table 1.

TABLE 1

| General diffractometer set-up | Diffraction pattern operations |
|---|---|
| 40 kV and 100 mA | Background subtraction |
| Primary side | $K\alpha_2$ strip of the peaks |
| Cu Kα radiation | 2θ correction towards the cBN |
| Flat graphite monochromator | PDF-file, 35-1365 |
| φ 0.5 mm point focus collimator | |
| Secondary side | |
| PSD detector | |
| Distance between detector and sample holder was 16 cm | |

Figure 2:
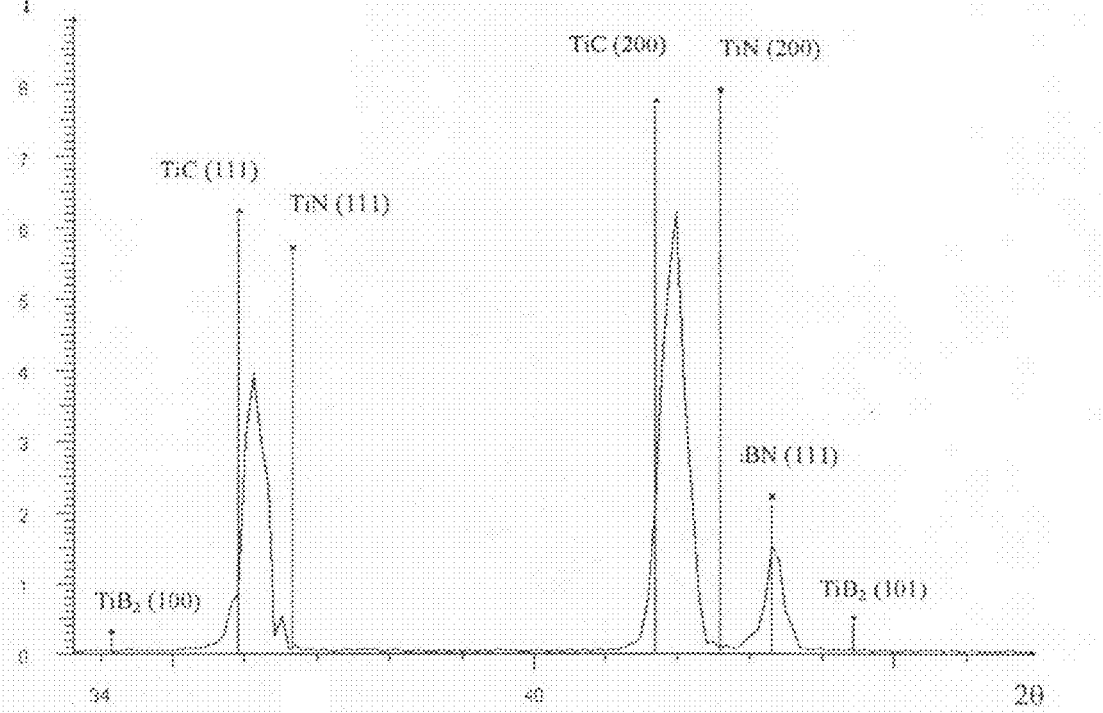
FIG. 2 shows XRD patterns of a cBN material according to the present invention.

The result of analysis is shown in FIG. 2. For comparison a prior art cBN material having 45 vol-% cBN was analyzed, also under the conditions according to Table 1, with the result shown in FIG. 3.

Figure 3:
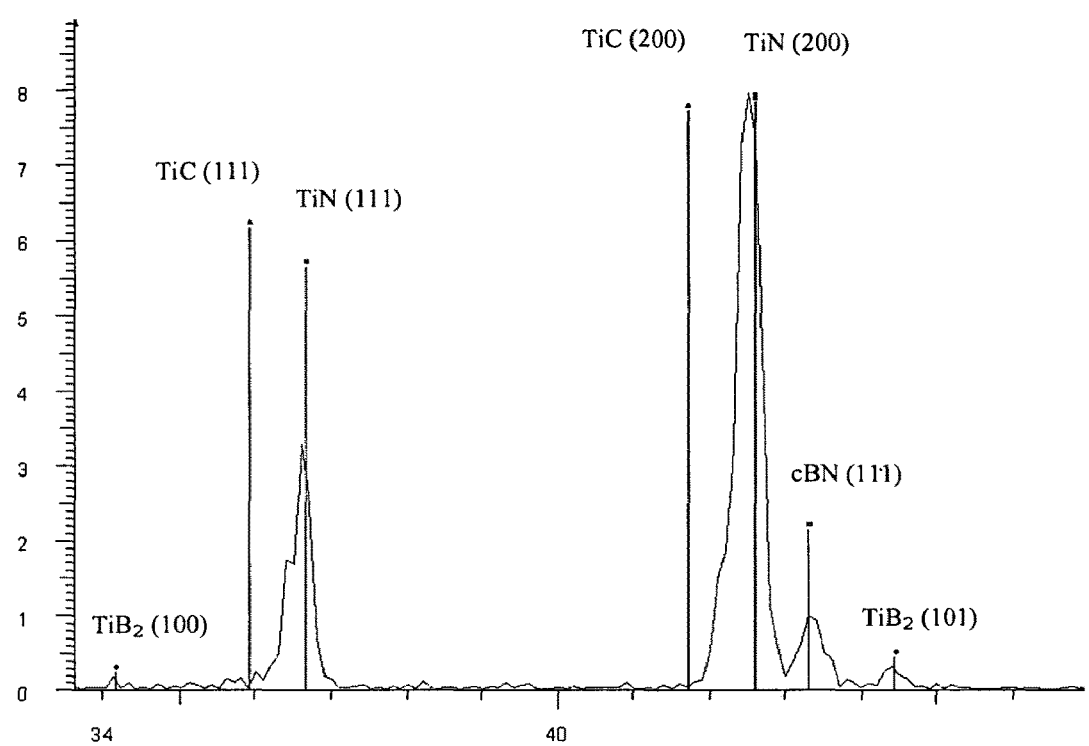
FIG. 3 shows XRD patterns of a cBN material according to prior art.

From FIG. 2 and FIG. 3 it is clear that the main difference between the inserts is the absence of the boride reaction phase, particularly $TiB_2$ or any borides of Ti, W, Co, Al or combinations of these. The strongest peaks of interest from the abovementioned $TiB_2$ is expected to be found in the chosen 2θ region in FIG. 2. The peak height ratio of the strongest $TiB_2$ peak and the strongest cBN peak in the insert according to the present invention is 0 whereas it in the prior art insert is 0.23.

The cBN inserts according to the invention were further analyzed metallographically. SEM images of polished cross sections of the cBN material were prepared and analyzed using image analysis (Leica Qwin). The cBN content was determined to 39.4 vol-%. The cBN grains had a bimodal grain size distribution, see FIG. 1.

EXAMPLE 2

The obtained cutting inserts according to the present invention from Example 1 were brazed to a cemented carbide body according to the Safe-Lok concept and further processed to form a cutting tool insert with designation CNGA 120408. The inserts were tested in a continuous turning operation with respect to wear resistance under the following conditions:

Work piece material: Induction Hardened Steel, HRC 60.
Speed: 250 m/min
Feed: 0.1 mm/rev
Depth of cut (DOC): 0.1 mm
Comment: Dry cutting As a reference the prior art inserts from Example 1 were used.

The maximum flank wear ($V_b$) after 8 min time in cut was used as performance measure.

Result
Average values after two tests:

|  | $V_b$ [$10^{-2}$ mm] |
|---|---|
| Prior art | 3 |
| Invention | 3 |

Material according to the invention has a comparable flank wear resistance compared to prior art.

EXAMPLE 3

The obtained cutting inserts according to the present invention from Example 1 were brazed to a cemented carbide body according to the Safe-Lok concept and further processed as to form a cutting tool insert with designation CNGA 120408. The inserts were tested in a continuous turning operation with respect to wear resistance and edge toughness under the following conditions:

Work piece material: Case Hardened Steel, HRC 58.
Speed: 200 m/min
Feed: 0.2 mm/rev
Depth of cut (DOC): 0.15 mm
Comment: Dry cutting As a reference the prior art inserts from Example 1 were used.

Result
The wear of two edged was evaluated after a 2 min period:

| Prior art | two edges chipped |
|---|---|
| Invention | two edges OK |

Material according to the invention has an improved edge toughness compared to prior art.

EXAMPLE 4

The obtained cutting inserts according to the present invention from Example 1 were brazed to a cemented carbide body according to the Safe-Lok concept and further processed to form a cutting tool insert with designation CNGA 120408. The inserts were tested with respect to toughness in a heavy intermittent turning operation under the following conditions:

Work piece material: Hardened Ball Bearing Steel, HRC 56
Speed: 120 m/min
Feed: 0.1-0.6 mm/rev
Depth of cut (DOC): 0.1-0.6 mm
Dry cutting The operation was a facing operation of a ring with a 10 mm slot. The feed and DOC were increased in intervals of 0.02 mm until chipping or fracture.

As a reference the prior art inserts from Example 1 were used. The invention was also compared with inserts of a cBN material according to patent application SE 0502391-6, having a similarly low $TiB_2$ content as the cBN material according to the invention, but with a cBN content of 65 vol-%.

Result
Each test was repeated four times. The average value of feed and DOC:

|  | Maximum feed mm/rev/DOC mm |
|---|---|
| Prior art | 0.31 |
| Outside invention, 65 vol-% cBN | 0.52 |
| Invention | 0.43 |

The inserts according to the present invention performed 30% better in fracture/chipping resistance in comparison with prior art inserts and had somewhat less toughness than the insert comprising a 65 vol-% cBN material.

EXAMPLE 5

The obtained cutting inserts according to the present invention from Example 1 were brazed to a cemented carbide body according to the Safe-Lok concept and further processed as to form a cutting tool insert with designation CNGA 120408. The inserts were tested in a continuous turning operation with respect to wear resistance under the following conditions:

Work piece material: Case Hardened Steel, HRC 60.
Speed: 250 m/min
Feed: 0.1 mm/rev
Depth of cut (DOC): 0.1 mm
Comment: Dry cutting As a reference the prior art inserts from Example 1 were used. The invention was also compared with inserts of a cBN material according to patent application US 2007/0099030, having a similarly low $TiB_2$ content as the cBN material according to the invention, but with a cBN content of 65 vol-%.

Result
The flank wear (Vb) was evaluated on one insert after an 8 min period:

|  | Vb [$10^{-2}$ mm] |
|---|---|
| Prior art | 4 |
| Outside invention, 65 vol-% cBN | 10 |
| Invention | 4 |

Material according to the invention has the same flank wear resistance compared to prior art and significantly better than the insert comprising a 65 vol-% cBN material.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:
1. A cutting tool insert composed of a composite comprising a cBN-phase and a binder phase comprising a titanium- carbonitride phase and a TiB$_2$ phase wherein a cBN content is from about 30 to less than about 60 vol-% and in an XRD pattern from the composite using CuKα-radiation a peak height ratio of a strongest (101) TiB$_2$ peak and a strongest cBN (111) peak is less than about 0.02 and a (200) peak from the titanium carbonitride phase intersects a vertical line of a PDF-line of TiN, PDF 38-1420, where an intersected point height is less than about 0.10 of a maximum (200) peak height of a ceramic binder phase.

2. The cutting tool insert of claim 1 wherein said composite comprises from about 35 to less than about 50 vol-% cBN.

3. The cutting tool insert of claim 1 wherein that said composite comprises from about 35 to less than about 48 vol-% cBN.

4. The cutting tool insert of claim 1 wherein said composite comprises from about 35 to less than about 45 vol-% cBN.

5. The cutting tool insert of claim 1 wherein the XRD pattern the peak height ratio from a strongest peak of any borides of Ti, W, Co, Al and combinations thereof and the strongest cBN peak is less than 0.06.

6. The cutting tool insert of claim 1 wherein said insert has a bimodal cBN grain size distribution comprising more than about 10 vol-% of one fraction having a grain size of from about 0.1 to about 1 μm and more than about 10 vol-% of a second fraction having a grain size of from about 2 to about 5 μm.

7. The cutting tool insert of claim 1 further comprising tungsten carbide and/or alumina in the composite.

8. The cutting tool insert of claim 1 wherein the (200) peak from the titanium carbonitride phase intersects a vertical line of an PDF-line of TiC, PDF 32-1383, and an intersected point height is at least about 0.10 of a maximum (200) peak height of the ceramic binder phase.

9. The cutting tool insert of claim 8 where an intersected point height is at least about 0.15 of the maximum (200) peak height of the ceramic binder phase.

10. The cutting tool insert of claim 1 wherein the (200) peak from the titanium carbonitride phase intersects the vertical line of the PDF-line of TiN, PDF 38-1420 and the intersected point height is less than about 0.05 of the maximum (200) peak height of the ceramic binder phase.

11. The cutting tool insert of claim 10 wherein the (200) peak from the titanium carbonitride phase does not intersect the vertical line of the PDF-line of TiN, PDF 38-1420.

\* \* \* \* \*